United States Patent
Amirfathi

(10) Patent No.: US 6,857,091 B2
(45) Date of Patent: Feb. 15, 2005

(54) METHOD FOR OPERATING A TAP CONTROLLER AND CORRESPONDING TAP CONTROLLER

(75) Inventor: Mansour Amirfathi, Cupertino, CA (US)

(73) Assignee: Infineon Technologies AG, Munich (DE)

( * ) Notice: Subject to any disclaimer, the term of this patent is extended or adjusted under 35 U.S.C. 154(b) by 433 days.

(21) Appl. No.: 10/152,495

(22) Filed: May 21, 2002

(65) Prior Publication Data

US 2002/0193960 A1 Dec. 19, 2002

Related U.S. Application Data

(63) Continuation of application No. PCT/EP01/10785, filed on Sep. 18, 2001.

(30) Foreign Application Priority Data

Oct. 13, 2000 (DE) ......................................... 100 50 707

(51) Int. Cl.[7] .............................................. G21R 31/28
(52) U.S. Cl. ....................................... 714/724; 714/726
(58) Field of Search .............................. 714/714, 726, 714/733, 734

(56) References Cited

U.S. PATENT DOCUMENTS

| 5,323,107 A | | 6/1994 | D'Souza ................. 324/158 P |
| 5,404,359 A | * | 4/1995 | Gillenwater et al. ........ 714/733 |
| 6,073,254 A | * | 6/2000 | Whetsel ........................ 714/30 |
| 6,711,707 B2 | * | 3/2004 | Haroun et al. ............... 714/726 |

FOREIGN PATENT DOCUMENTS

DE 198 35 608 A1 10/2000 ........... G06F/13/00

OTHER PUBLICATIONS

"The Institute of Electrical and Electronics Engineers: IEEE Standard Test Access Port and Boundary–Scan Architecture," IEEE Standard 1149.1–1990, New York, 1990, S. 3–1 to 3–5, 5–1 to 8–8, and 5–16f.

Andrews, J., "IEEE Standard Boundary Scan 1149.1—An Introduction," Electro International Conference Record, Western Periodicals Co., Ventura, California, vol. 16, pp. 522–527, XP000288428.

* cited by examiner

*Primary Examiner*—Phung My Chung
(74) *Attorney, Agent, or Firm*—Withrow & Terranova, PLLC

(57) ABSTRACT

The present invention provides a method for operating a TAP controller having a first input terminal (Etms) for inputting a logic test mode selection signal (tms) and a second input terminal (Etrst) for inputting a logic reset signal (trst); the TAP controller being configured in such a way that it is in a test mode if the test mode selection signal (tms) has a first logic state ("0"), and it is in no test mode if the test mode selection signal (tms) has a second logic state ("1"), that it can be reset asynchronously by single application of the logic reset signal (trst) from the first logic state ("0"); the method having the following steps: provision of an external logic reset signal (reset_n): formation of a logic ORing of the external logic reset signal (reset_n) and the inverted logic test mode selection signal (tms) for the generation of the logic reset signal (trst); and application of the logic reset signal (trst) generated by the logic ORing to the second input terminal (Etrst). The invention provides a corresponding TAP controller.

6 Claims, 3 Drawing Sheets

US 6,857,091 B2

METHOD FOR OPERATING A TAP CONTROLLER AND CORRESPONDING TAP CONTROLLER

This application is a continuation of International Application number PCT/EP01/10785, filed Sep. 18, 2001, pending, which claims the benefit of German application no. DE 100 50 707.7, filed Oct. 13, 2000, pending.

FIELD OF THE INVENTION

The present invention relates to a method for operating a TAP controller having a first input terminal for inputting a logic test mode selection signal and a second input terminal for inputting a logic reset signal; the TAP controller being configured in such a way that it is in a test mode if the test mode selection signal has a first logic state, and it is in no test mode if the test mode selection signal has a second logic state, that it can be reset asynchronously by single application of the logic reset signal from the first logic state. The invention likewise relates to a corresponding TAP controller.

BACKGROUND OF THE INVENTION

FIG. 2 shows a schematic illustration of a known TAP controller.

In FIG. 2, reference symbol TAP designates a TAP controller (TAP=Test Access Port). Such a TAP controller is situated together with further integrated circuits, which are to be tested by corresponding test programs, on a chip. The TAP controller has an input Etdi for a test data signal tdi, an input Etck for a test clock signal tck, an input Etms for a test mode signal tms and an input Etrst for a test reset signal trst. The inputting of the test reset signal trst for the TAP controller is optional. The provided input Etrst for the test reset signal trst is recommended but is not absolutely necessary in accordance with the IEEE 1149.1 standard.

Also depicted in FIG. 2 is an output A for an output control signal for circuit components (not shown) to be tested.

The test data signal tdi is fed via a corresponding line from a test data signal pad Ptdi to the input Etdi. The test clock signal tck is fed via a corresponding line from a test data signal pad Ptck to the input Etck. The test mode signal tms is fed via a corresponding line from a test mode signal pad Ptms to the input Etms. Furthermore, on the chip of the known TAP controller, there is a pad Prst for an external reset signal reset_n, which can be supplied via a corresponding line to specific circuit components of the circuit components to be tested, in order to reset them in the context of a system reset.

FIG. 3 shows a state chart of the known TAP controller.

In FIG. 3, RST designates a reset state, RT designates a test state, DR1–DR7 designate data register states and IR1-IR7 designate instruction register states. The ones "1", and zeros "0" associated with the respective arrows designate how the state changes cyclically when a corresponding test mode signal tms is applied to the input Etms.

In the concrete example, the states have the meanings listed in the table below:

| DR1 | Selection data register scan | IR1 | Selection instruction register scan |
|---|---|---|---|
| DR2 | Incorporation data in data register | IR2 | Incorporation data in instruction register |
| DR3 | Shift data register | IR3 | Shift instruction register |
| DR4 | Output 1 data register | IR4 | Output 1 instruction register |
| DR5 | Pause data register | IR5 | Pause instruction register |
| DR6 | Output 2 data register | IR6 | Output 2 instruction register |
| DR7 | Refresh data register | IR7 | Refresh instruction register |

By way of example, the status IR3, i.e. the status "shift instruction register" is reached from the reset state RST by means of the following serial data word, "01100". As long as the "0" is held in the test mode signal, in the status IR3 the instruction register is shifted by one bit upon each clock cycle. The reset state RST is reached from the state "shift instruction register" IR3 by means of the signal sequence "11111".

As can be seen from FIG. 3, more than five successive states logic "1" of the test mode signal are required for this synchronous resetting proceeding from no state.

However, in the case of certain applications and under certain preconditions, it would be desired to achieve a reset state of the TAP controller by means of a single clock cycle. This can be done, in principle, by inputting a logic "0" into the input Etrst for the test reset signal trst. TAP controllers without any inputting of a test reset signal trst have the following two disadvantages. Firstly, a simulation problem arises because, without the resetting, the TAP controller assumes an undefined state, and all the output signals are undefined in this case. The other problem is a hardware problem because the TAP controller can assume an undefined state on account of an unstable crystal frequency during switch-on and trigger an uncontrolled test mode which, depending on the test mode, could be cleared by a test reset signal trst with little complexity.

Although the TAP controller TAP can thus be reset asynchronously at the input Etrst for the test reset signal trst in a single clock cycle, the number of pads on a chip is limited for space reasons and/or cost reasons, and an additional pad for this test reset signal trst (indicated by broken lines in FIG. 2) is not possible in many cases. In cases where an additional pad is possible, the additional pad causes additional costs.

Secondly, the external reset signal reset_n cannot be applied to the input Etrst directly from the pad Prst present therefor, since such resetting can result in undefined states and, in accordance with the IEEE 1149.1 standard, it should not be possible to change the TAP controller state uncontrollably.

Therefore, it is an object of the present invention to provide a method for operating a TAP controller in which controlled asynchronous resetting is possible without the need for a further pad for a test reset signal.

According to the invention, this object is achieved by means of the method defined in claim 1 and the TAP controller specified in claim 4.

SUMMARY OF THE INVENTION

The idea underlying the present invention is that an external logic reset signal is provided and a logic ORing of the external logic reset signal and the inverted logic test mode selection signal is formed for the purpose of generating the logic reset signal. The logic reset signal generated by the logic ORing is applied to the second input terminal.

A particular advantage of the present invention is that no additional pad is necessary, and the external reset signal or system reset signal reset_n can be used for generating the test reset signal trst.

The requisite combination of the line for the test mode signal with the line for the reset signal and the provision of an inverter and an OR gate can be realized significantly more simply than an additional pad.

According to the invention, the test mode signal is used to logically control whether or not the system reset signal is also intended to reset the TAP controller. This procedure likewise conforms to the IEEE 1149.1 standard.

Advantageous developments and improvements of the respective subject matter of the invention can be found in the subclaims.

In accordance with one preferred development, the TAP controller can be reset synchronously by repeated application of the logic test mode selection signal from the second logic state, while the external logic reset signal is in the second logic state.

In accordance with a further preferred development, the TAP controller can be reset asynchronously by single application of the external logic reset signal from the first logic state, while the logic test mode selection signal is in the second logic state.

In accordance with a further preferred development, the TAP controller changes the instantaneous test mode upon each renewed application of the logic test mode selection signal from the second logic state.

An exemplary embodiment of the invention is illustrated in the drawings and is explained in more detail in the description below.

BRIEF DESCRIPTION OF THE DRAWING FIGURES

In the figures, identical reference symbols designate identical or functionally identical components.

Figure 1:
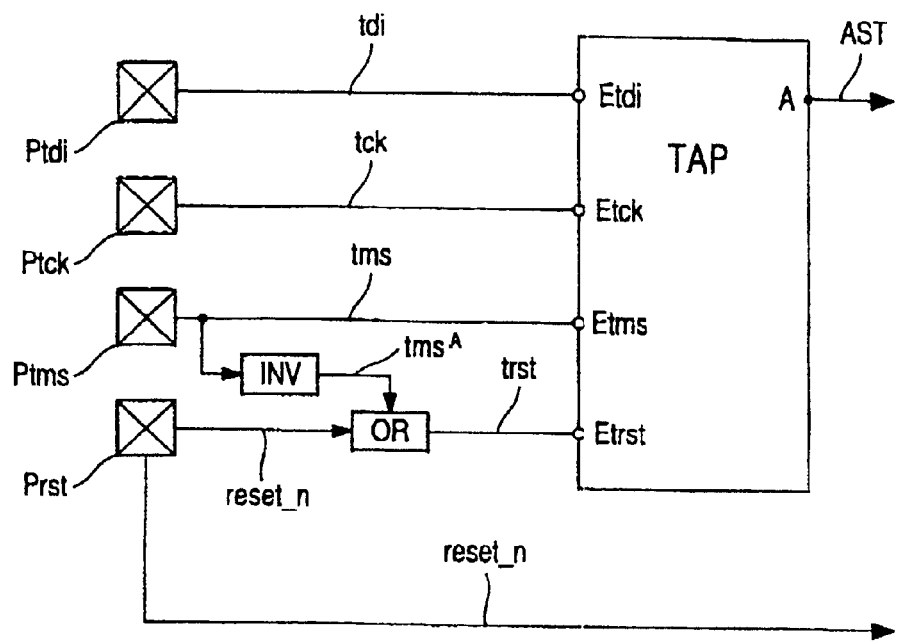
FIG. 1 shows a schematic illustration of a TAP controller in accordance with one embodiment of the present invention.

In FIG. 1, in addition to the reference symbols already introduced, INV designates an inverter and OR designates an ORing device.

This embodiment is a TAP controller having a first input terminal Etms for inputting a logic test mode selection signal tms, a second input terminal Etrst for inputting a logic reset signal trst, a third input terminal Etck for inputting a logic clock signal tck and a fourth input terminal Etdi for inputting digital test data tdi.

The TAP controller is configured in such a way that it is in a test mode if the test mode selection signal tms is in the logic state "0", and it is in no test mode if the test mode selection signal tms is in the logic state "1".

The TAP controller can be reset asynchronously in one clock cycle by single application of the logic reset signal trst from the logic state "0" (active low).

Figure 2:
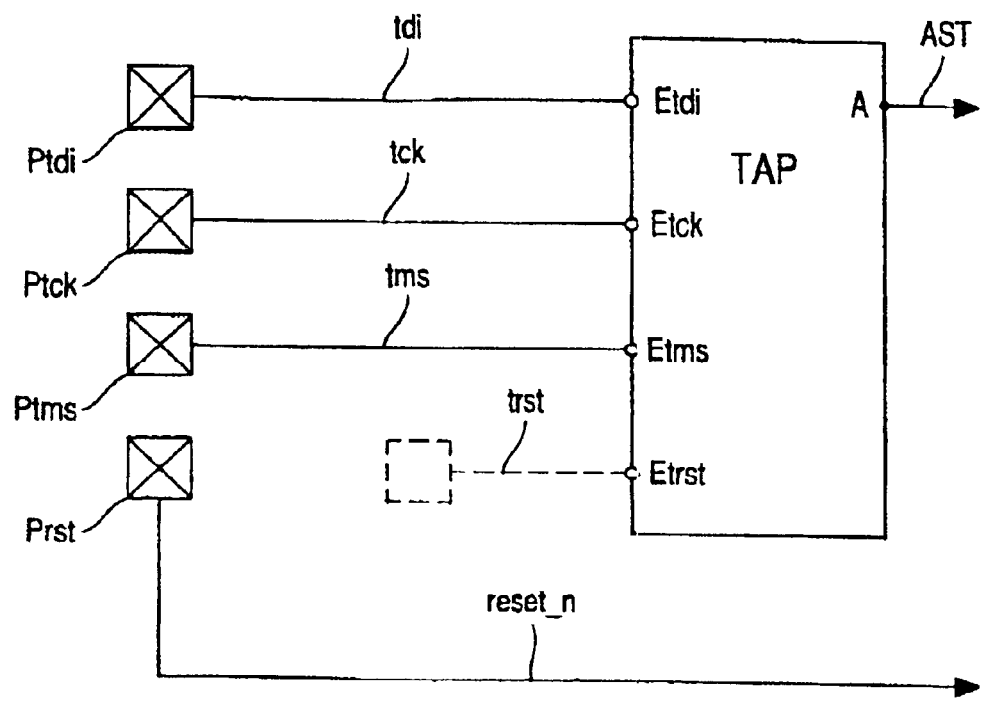
FIG. 2 shows a schematic illustration of a known TAP controller.
Figure 3:
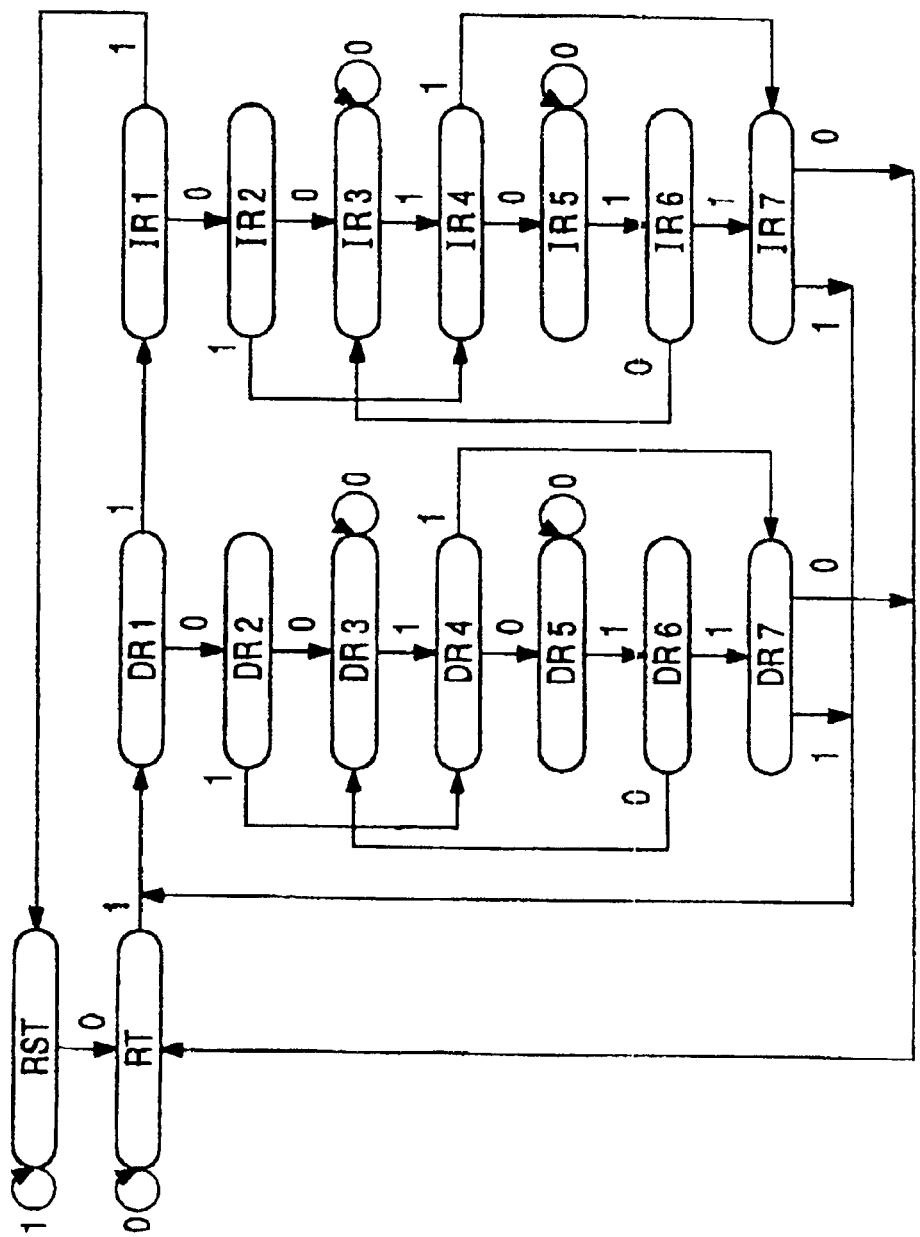
FIG. 3 shows a state chart of the known TAP controller.

The TAP controller can be reset synchronously by repeated application of the logic test mode selection signal tms from the logic state "1" (cf. FIGS. 2 and 3).

There is a first signal pad Prst for providing an external logic reset signal or system reset signal reset_n and a second signal pad Ptms for providing the logic test mode selection signal tms. Furthermore, there is the pad Ptdi for providing the test data and the pad Ptck for providing the clock signal. Respective lines are provided between the pads and the inputs of the TAP controller.

Consequently, the basic construction is identical to that of the TAP controller according to FIG. 2. However, in this embodiment, the signals tms and reset_n are combined as follows in order to form the signal trst.

The inverter INV, which is connected to the second signal pad Ptms by a corresponding line, serves for inverting the logic test mode selection signal tms. The logic ORing device OR, which is connected to the first signal pad Prst and the output of the inverter INV, serves for forming a logic ORing of the external logic reset signal reset_n and the inverted logic test mode selection signal tms* and for generating the logic reset signal trst in accordance with the combination result.

In this case, the logic reset signal trst generated by the logic ORing device OR is applied via a corresponding line to the second input terminal Etrst.

Consequently, it is possible, on the one hand, that the TAP controller is reset synchronously by repeated application of the logic test mode selection signal tms from the logic state "1" while the external logic reset signal reset_n is in the logic state "1".

On the other hand, the TAP controller can be reset asynchronously by single application of the external logic reset signal reset_n from the logic state "0", while the logic test mode selection signal tms is in the logic state "1".

Although the present invention has been described above using a preferred exemplary embodiment, it is not restricted thereto, but rather can be modified in diverse ways. In particular, the number of TAP states and input signals and output signals is chosen only by way of example.

| List of reference symbols | |
|---|---|
| TAP | TAP controller |
| AST | Output control signal |
| A | Output |
| Etdi | Input for test data signal |
| Etck | Input for test clock signal |
| Etms | Input for test mode signal |
| Etrst | Input for test reset signal |
| tdi | Test data signal |
| tck | Test clock signal |
| tms | Test mode signal |
| tms* | Inverted test mode signal |
| trst | Test reset signal |
| Ptdi | Pad for test data signal |
| Ptck | Pad for test clock signal |
| Ptms | Pad for test mode signal |
| Prst | Pad for external reset signal |
| INV | Inverter |
| OR | ORing device |
| reset_n | External reset signal |
| RST | Reset state |
| RT | Test state |
| DR1-7 | Data register states |
| IR1-7 | Instruction register states |

What is claimed is:

1. Method for operating a TAP controller having a first input terminal (Etms) for inputting a logic test mode selection signal (tms) and a second input terminal (Etrst) for inputting a logic reset signal (trst); the TAP controller being configured in such a way that it is in a test mode if the test mode selection signal (tms) has a first logic state ("0"), and it is in no test mode if the test mode selection signal (tms) has a second logic state ("1"), that it is reset asynchronously from the test mode into the non-test mode by single application of the logic reset signal (trst) with the first logic state ("0"); the method having the following steps:

provision of an external logic reset signal (reset_n):

formation of a logic ORing of the external logic reset signal (reset_n) and the inverted logic test mode selection signal (tms) for the generation of the logic reset signal (trst); and application of the logic reset signal (trst) generated by the logic ORing to the second input terminal (Etrst).

2. Method according to claim 1, characterized in that the TAP controller is reset synchronously by repeated application of the logic test mode selection signal (tms) with the second logic state ("1"), while the external logic reset signal (reset_n) has the second logic state ("1").

3. Method according to claim 1, characterized in that the TAP controller is reset asynchronously by single application of the external logic reset signal (reset_n ), with the first logic state ("0") while the logic test mode selection signal (tms) has the second logic state ("1").

4. TAP controller having:

a first input terminal (Etms) for inputting a logic test mode selection signal (tms) and a second input terminal (Etrst) for inputting a logic reset signal (trst); the TAP controller being configured in such a way that it is in a test mode if the test mode selection signal (tms) has a first logic state ("0"), and it is in no test mode if the test mode selection signal (tms) has a second logic state ("1"), that it is reset asynchronously from the test mode into the non-test mode by single application of the logic reset signal (trst) with the first logic state ("0");

a first signal pad (Prst) for providing an external logic reset signal (reset_n);

a second signal pad (Ptms) for providing the logic test mode selection signal (tms);

an inverting device (INV), which is connected to the second signal pad (Ptms) for inverting the logic test mode selection signal (tms); and a logic ORing device (OR), which is connected to the first signal pad (Prst) at the output of the inverting device (INV), for forming a logic ORing of the external logic reset signal (reset_n) and the inverted logic test mode selection signal (tms*) and for generating the logic reset signal (trst); the logic reset signal (trst) generated by the logic ORing device (OR) being applied to the second input terminal (Etrst).

5. TAP controller according to claim 4, characterized in that it is reset synchronously by repeated application of the logic test mode selection signal (tms) with the second logic state ("1").

6. TAP controller according to claim 4, characterized in that it changes the instantaneous test mode upon each renewed application of the logic test mode selection signal (tms) with the second logic state ("1").

* * * * *